US006729940B2

(12) United States Patent
Farmer et al.

(10) Patent No.: US 6,729,940 B2
(45) Date of Patent: May 4, 2004

(54) APPARATUS FOR STRIPPING COATING

(75) Inventors: Gilbert Farmer, Cincinnati, OH (US); Jeffrey Arnold Fehrenbach, Cincinnati, OH (US); William Lee Imhoff, Hamilton, OH (US); David Allen Kastrup, West Chester, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/369,425

(22) Filed: Feb. 19, 2003

(65) Prior Publication Data

US 2003/0152713 A1 Aug. 14, 2003

Related U.S. Application Data

(62) Division of application No. 09/878,847, filed on Jun. 11, 2001, now Pat. No. 6,561,872.

(51) Int. Cl.[7] .............................................. C23C 16/00
(52) U.S. Cl. .......................................... 451/35; 451/28
(58) Field of Search ............................. 451/28, 29, 30, 451/36, 38, 75, 102

(56) References Cited

U.S. PATENT DOCUMENTS 4,288,269 A 9/1981 Batiuk
5,087,486 A * 2/1992 DeVos et al. ............... 427/264
5,167,721 A 12/1992 McComas et al.
5,472,369 A 12/1995 Foster et al.
5,565,035 A * 10/1996 Sylvestro et al. ........... 118/721
5,813,118 A 9/1998 Roedl et al.
5,849,099 A 12/1998 McGuire
5,942,045 A 8/1999 Raghavan et al.
5,970,993 A 10/1999 Witherspoon et al.
5,998,755 A 12/1999 Zajchowski et al.
6,013,308 A 1/2000 Saito
6,287,389 B1 9/2001 McGuire

* cited by examiner

*Primary Examiner*—Joseph J. Hail, III
*Assistant Examiner*—Shantese McDonald
(74) *Attorney, Agent, or Firm*—VG Ramaswamy; Sonnenschein Nath & Rosenthal LLP

(57) ABSTRACT

A method of stripping coating from a portion of a coated surface of a component. The method includes fastening a mask sheet to the component over a region adjacent the portion of the coated surface. The mask sheet has a contour generally corresponding to a contour of the surface of the component. A high pressure fluid jet is sprayed from a spray head toward the portion of the coated surface after the mask sheet is fastened to the component to strip the coating from the portion of the surface. After the coating is stripped from the portion of the surface, the mask sheet is removed from the component.

5 Claims, 6 Drawing Sheets

APPARATUS FOR STRIPPING COATING

CROSS REFERENCE TO RELATED APPLICATION

This is a divisional of U.S. application Ser. No. 09/878,847, filed on Jun. 11, 2001, now U.S. Pat. No. 6,561,872 which is incorporated herein by reference to the extent permitted by law.

BACKGROUND OF THE INVENTION

The present invention relates generally to a method and apparatus for stripping coating from a component, and more particularly to a method and apparatus for stripping coating from only a portion of a coated surface of a component.

Various methods are used to protect metal components exposed to high temperature environments. For instance, thermal barrier coatings are applied to surfaces of components exposed to high temperature environments to reduce the amount of heat which is transferred to the component. However, if the thermal barrier coatings are damaged (e.g., by field exposure or handling damage) the protection offered by the coatings may be compromised necessitating a repair. Typically, the coating is repaired by stripping the damaged coating and applying a new coating. This procedure is complicated by the presence of cooling holes in the component.

Although damaged thermal barrier coating can be repaired by conventional methods of stripping the damaged coating from the entire component and applying a new coating to the component, cooling holes must be masked before applying the new coating or they must be re-drilled (e.g., by laser drilling) after applying the new coating to ensure the holes are not blocked by the coating. These masking and/or re-drilling operations increase the cost of repairing damaged thermal barrier coatings. By reducing the amount of coating which is stripped, significant time and expense can be avoided by reducing the masking needed when the new coating is applied or by reducing the amount of re-drilling which may be required. Thus, there is a need for a method and apparatus for stripping coating from only a portion of a component.

SUMMARY OF THE INVENTION

Among the several features of the present invention may be noted the provision of a method of stripping coating from a portion of a coated surface of a component. The method comprises the step of fastening a mask sheet to the component over a region adjacent the portion of the coated surface. The mask sheet has a contour generally corresponding to a contour of the surface of the component. Further, the method includes the step of spraying a high pressure fluid jet from a spray head toward the portion of the coated surface after the mask sheet is fastened to the component to strip the coating from the portion of the surface. In addition, the method includes removing the mask sheet from the component after the coating is stripped from the portion of the surface.

In another aspect, the present invention includes an apparatus for masking a surface of a component to permit selective stripping of coating therefrom. The apparatus comprises a flexible sheet sized and shaped for positioning over a region of the surface of the component adjacent a portion of the coated surface to be stripped. The apparatus also includes a clamp for forming the flexible sheet to a contour generally corresponding to a contour of the surface of the component and for holding the sheet in position adjacent the surface of the component. Further, the apparatus includes a fastener for fastening the clamp to at least one of the surface of the component and the sheet.

Other features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
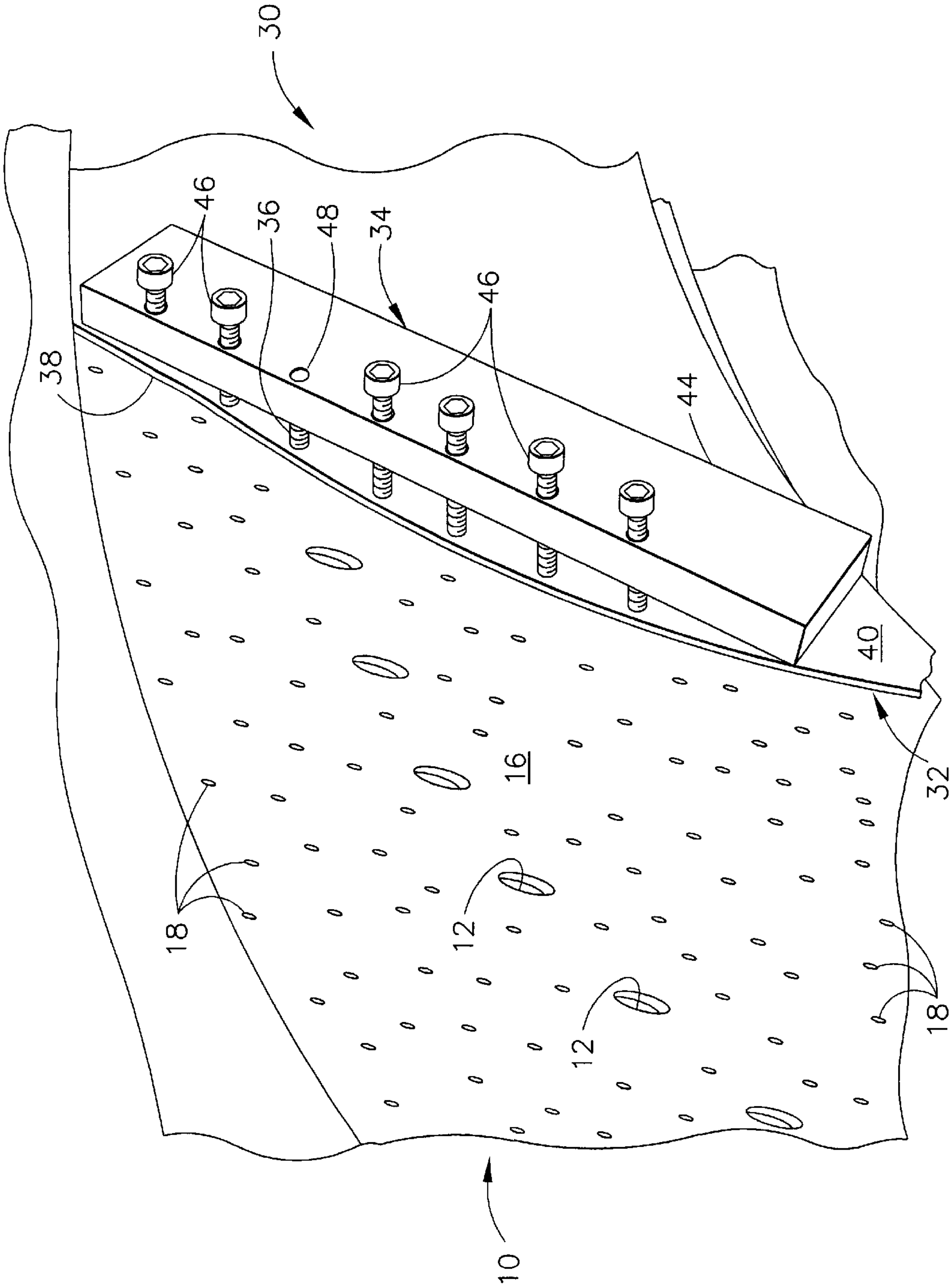
FIG. 1 is a perspective of a coated interior surface of a component showing apparatus of the present invention installed thereon.

Referring now to the drawings and in particular to FIG. 1, a metal component such as an outer combustion chamber liner of an aircraft engine is designated in its entirety by the reference number 10. The component 10 has a plurality of mixing holes 12 extending from an exterior surface 14 (FIG. 2) of the component to a coated interior surface 16 of the component. The interior surface 16 is coated with a thermal barrier coating. The component 10 also has a plurality of film cooling holes 18 extending through the component from the exterior surface 14 to the coated interior surface 16. The sizes, locations and orientations of these holes are not critical to the present invention. Because the features of the component 10 are conventional and well understood by those skilled in the art, they will not be described in further detail.

Figure 2:
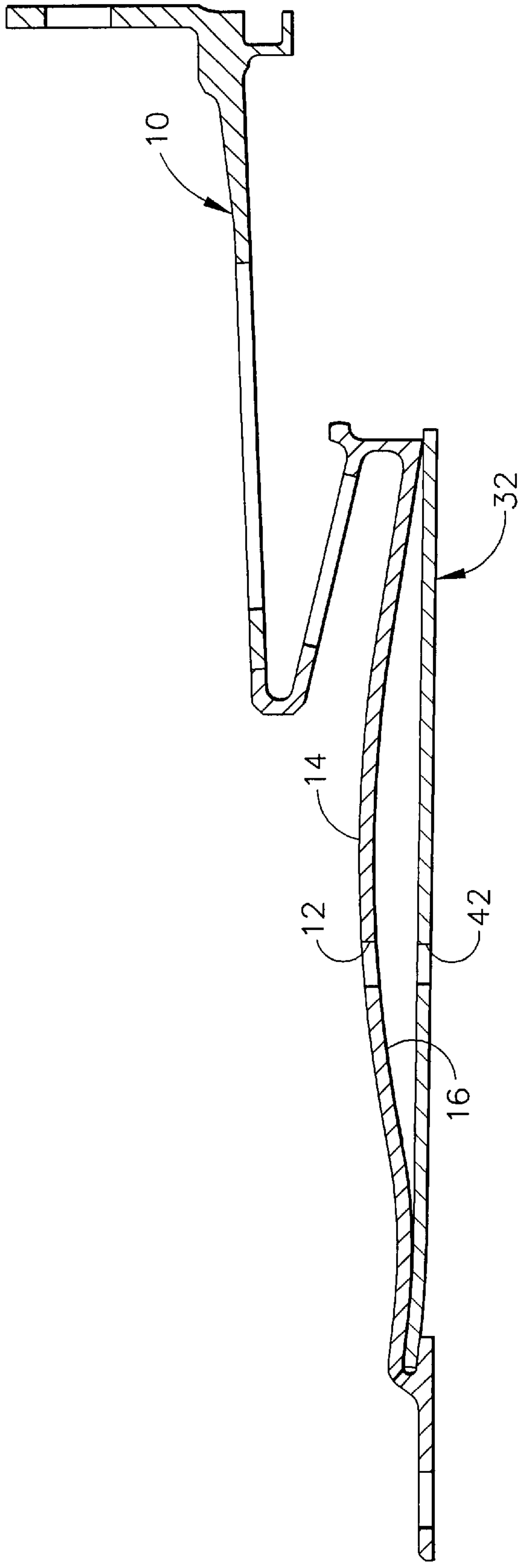
FIG. 2 is a section of the component showing a flexible mask sheet of the apparatus of the present invention positioned adjacent the coated surface of the component.

As further illustrated in FIG. 1, apparatus of the present invention for masking a surface of the component 10 to permit selective stripping of coating therefrom is designated in its entirety by the reference number 30. The apparatus 30 comprises a flexible sheet (generally designated by 32), a clamp (generally designated by 34), and a fastener 36 for fastening the clamp to the coated surface 16 of the component 10 and/or the sheet. As illustrated in FIG. 1, the flexible sheet 32 is sized and shaped for positioning over a region of the surface 16 of the component 10 adjacent the portion of the coated surface to be stripped. Although the sheet 32 may cover less of the interior surface 16 of the component 10 without departing from the scope of the present invention, in one embodiment the sheet covers substantially all of the coated surface of the component except the portion to be stripped. Although the sheet 32 may be made of any sheet material which is flexible and resistant to damage from a high pressure fluid jet, in one embodiment the sheet is a scrap metal sheet (e.g., Hastelloy® metal alloy or aluminum) having a thickness of between about 0.010 inches and about 0.040 inches. Hastelloy is a federally registered trademark of Haynes International, Inc. Corporation of Kokomo, Ind. It is critical that the sheet 32 be sufficiently thin that it can be easily formed to a contour generally corresponding to a contour of the surface 16 of the component 10 yet sufficiently thick that it is resistant to damage from the high pressure fluid jet. The sheet 32 includes opposite ends 38 (only one of which is shown in FIG. 1) which define boundaries of the portion of the coated surface to be stripped. Edge margins 40 adjacent the ends 38 receive the clamps 34. As illustrated in FIG. 2, a hole 42 is provided in each edge margin 40 of the sheet 32 for receiving the fastener 36 as will be explained in further detail below.

The clamp 34 comprises an elongate body 44 sized for spanning at least a portion of the sheet 32 and a plurality of jack screws 46 threaded through the body for biasing the sheet 32 toward the surface 16 of the component 10. Although the body 44 may have other lengths without departing from the scope of the present invention, in one embodiment the body is about six inches long. Although the body 44 may be made of other materials without departing from the scope of the present invention, in one embodiment the body is made of aluminum. As illustrated in FIG. 1, the body 44 of one embodiment has a plurality of holes 48 aligned in a longitudinal row. Although the body 44 may have fewer or more holes 48 without departing from the scope of the present invention, in one embodiment the body has seven evenly spaced holes. Although the holes 48 may have other spacing without departing from the scope of the present invention, in one embodiment the holes are equally spaced about ¾ inch apart. As will be appreciated by those skilled in the art, the spacing between the holes 48 may be varied along the length of the body without departing from the scope of the present invention.

One of the holes 48 receives the fastener 36 for fastening the clamp 34 to the coated surface 16 of the component 10 and/or the sheet 32. Although other fasteners 36 may be used without departing from the scope of the present invention, in one embodiment the fastener is a threaded screw fastener, and more particularly a 1.5 inch long ¼×20 machine bolt. Preferably, the fastener 36 is inserted through one of the plurality of mixing holes 12 extending through the component 10, through one of the holes 42 provided in the sheet 32 and threaded into the respective hole 48 in the body 34. Each of the remaining holes 48 receives one of the jack screws 46 for biasing the sheet 32 toward the surface 16 of the component 10. Although other threaded fasteners may be used as jack screws 46 without departing from the scope of the present invention, in one embodiment the jack screws are one inch long ¼×20 Allen head bolts. Preferably, the jack screws 46 engage the sheet 32 at discrete locations along its edge margins 40 as shown in FIG. 1.

Figure 3:
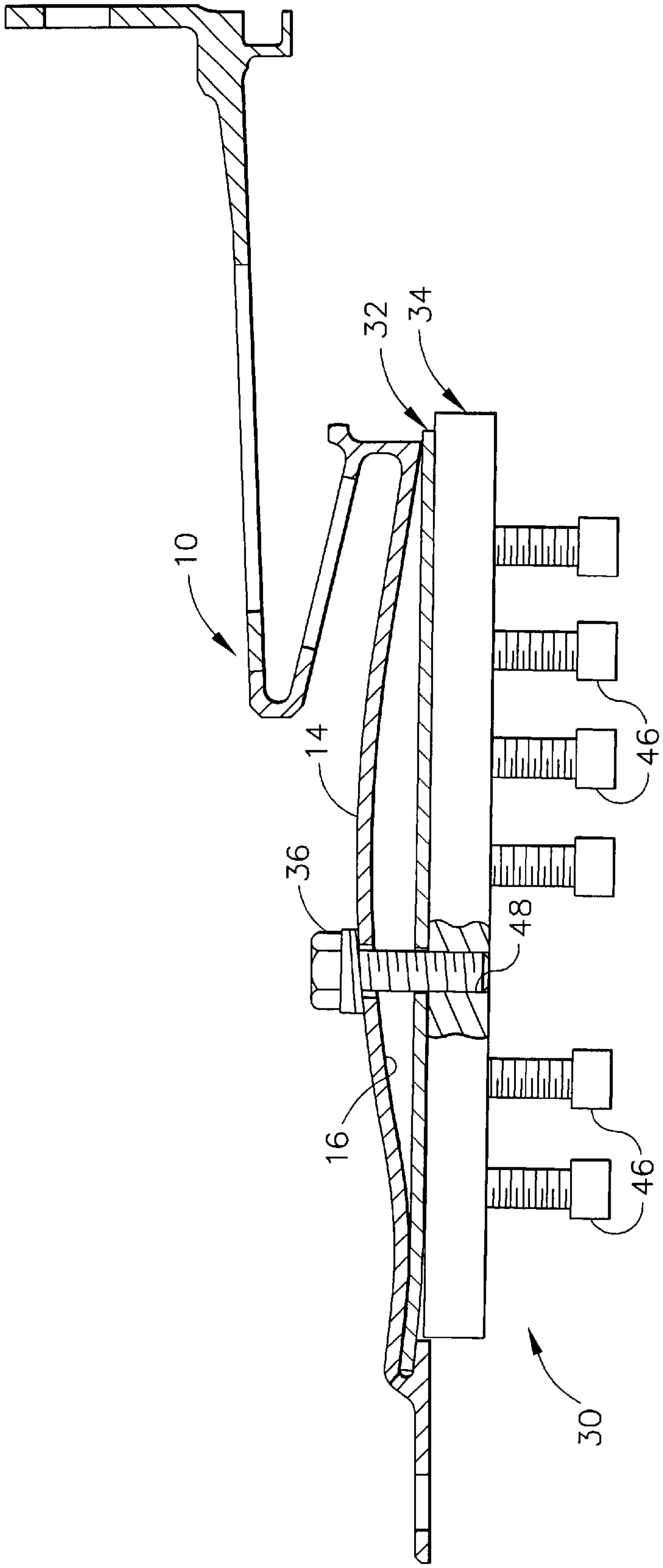
FIG. 3 is a section similar to FIG. 2 showing a clamp of the apparatus fastened to the component and the sheet.
Figure 4:
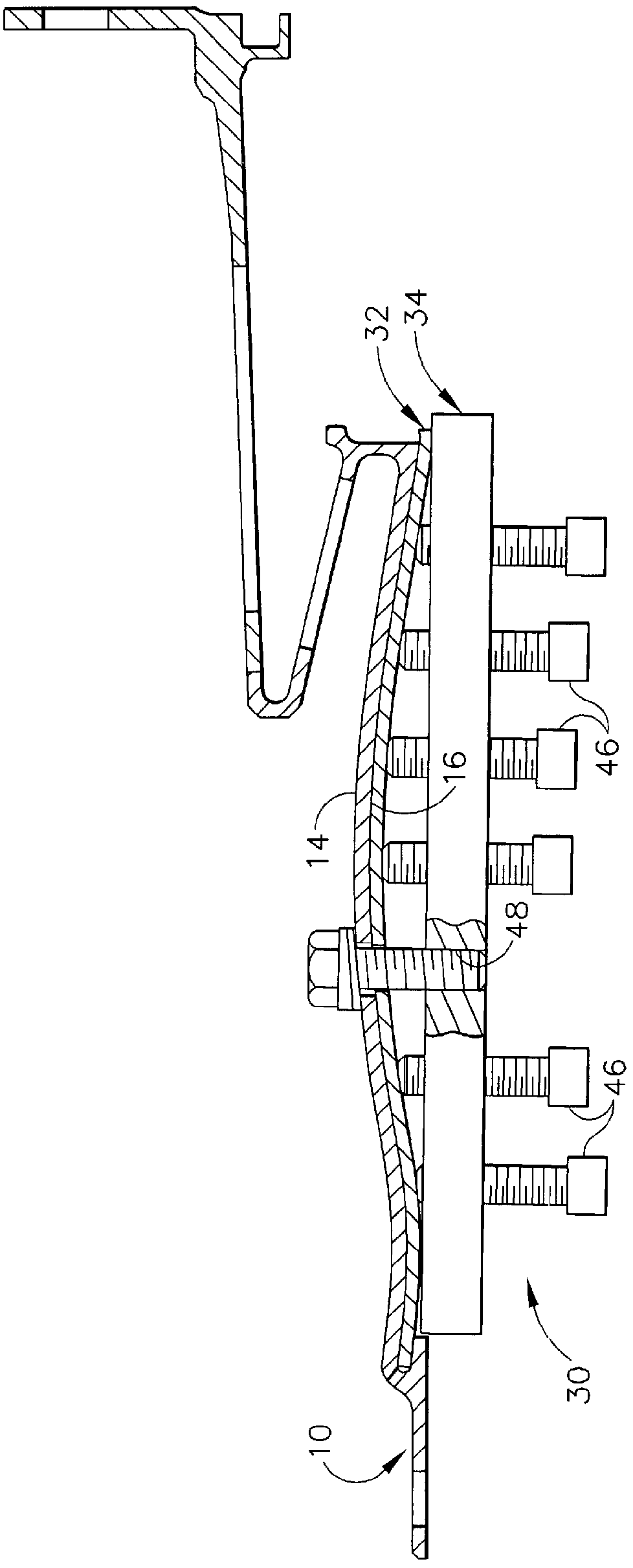
FIG. 4 is a section similar to FIG. 3 showing the clamp forming the flexible sheet to a contour generally corresponding to that of the coated surface of the component.
Figure 5:
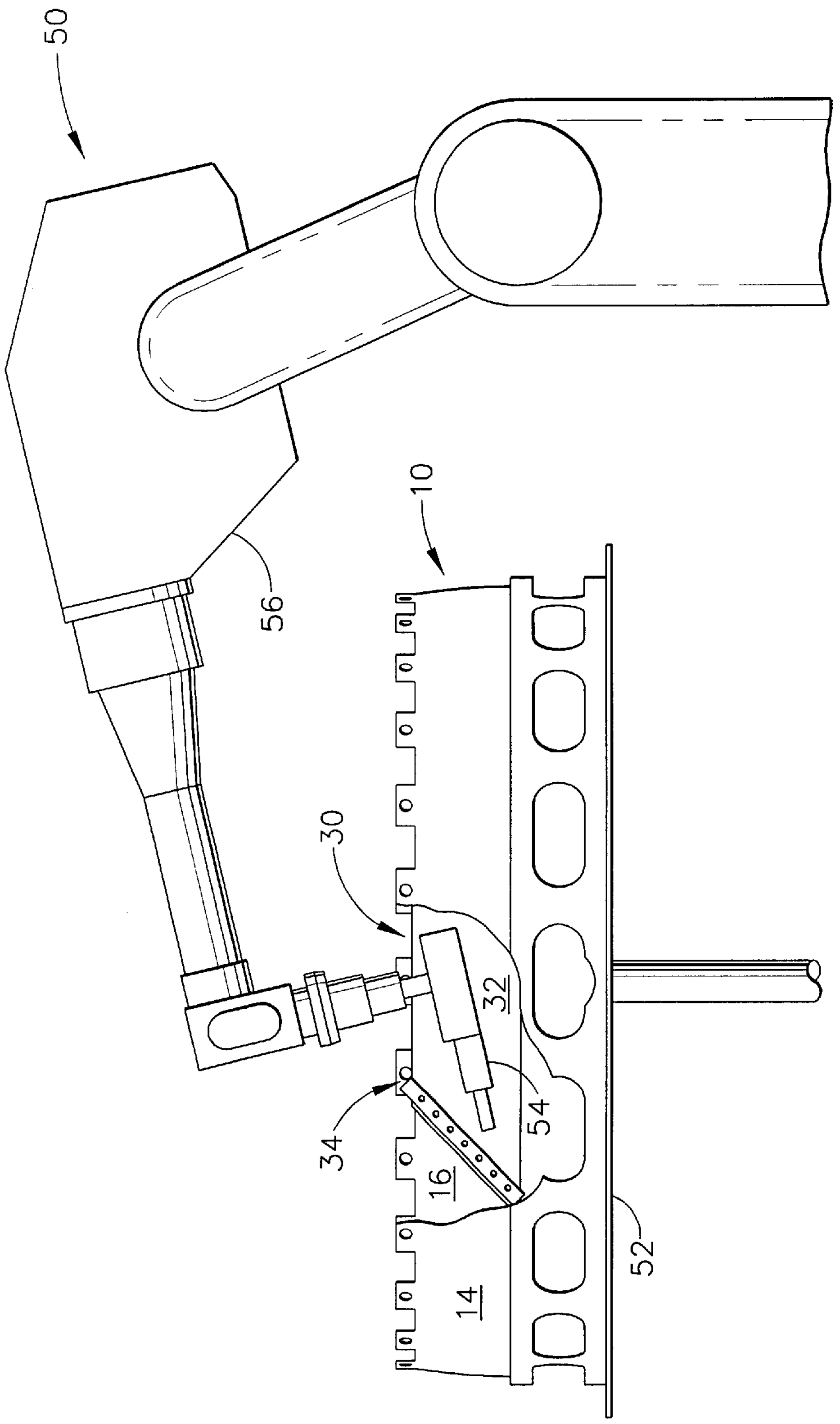
FIG. 5 is an elevation of a high pressure fluid jet system for stripping coating from a portion of a coated interior surface of a component using the method of the present invention.

The apparatus 30 described above is used when stripping coating from a portion of a coated surface 16 of a component 10 to mask an adjacent region of the surface to prevent removal of coating from the region. To install the apparatus 30, the flexible mask sheet 32 is positioned over the region of the surface 16 adjacent the portion of the coated surface to be stripped as illustrated in FIG. 2. Once the sheet 32 is in position, a hole 42 is formed in the sheet in line with the selected mixing hole 12. The fastener 36 is inserted through the mixing hole 12 and the hole 42 in the sheet 32 and threaded in the corresponding hole 48 in the body 44 to fasten the sheet to the component 10 over the region adjacent the portion of the coated surface to be stripped as illustrated in FIG. 3. It is envisioned that other means may be used to fasten the sheet 32 and the clamp 34 to the component 10. For example, a C-clamp may be used to fasten the sheet 32 and the clamp 34 to the component 10. Once the fastener 36 is tight, the jack screws 46 are tightened as illustrated in FIG. 4 to bias the sheet 30 toward the interior surface 16 and to deform the sheet to have a contour generally corresponding to the contour of the interior surface of the component 10. The procedure described above is repeated for the other end of the mask sheet 32, and the component 10 is loaded onto a conventional high pressure fluid jet system, generally designated by 50, as illustrated in FIG. 5 for further processing. Alternatively, it is envisioned that only one clamp 34 may be installed on one end 38 of the sheet or that one or more clamps may be installed between the edge margins 40 without departing from the scope of the present invention.

The system 50 includes a part support such as a rotatable turntable 52 sized and shaped for receiving the component 10. A conventional high pressure fluid jet spray head 54 adjacent the turntable 52 sprays a fluid such as water toward the interior coated surface 16 of the component 10. The spray head 54 is mounted on a robotic arm 56 for manipulating the head into position relative to the component 10. The spray head 54 sprays a high pressure fluid jet toward the portion of the coated surface 16 to strip the coating from the portion of the surface. Although the high pressure jet may be sprayed over the entire surface 16 including the region protected by the mask sheet 32, in one embodiment the jet is only sprayed toward the portion of the coated surface and the edge margins 40 of the mask sheet 32 during the spraying step. Although other systems may be used without departing from the scope of the present invention, the high pressure fluid jet system 50 of the preferred embodiment is a Model No. 1015 5-axis computer numerically controlled high pressure fluid jet system available from Progressive Technologies of Grand Rapids, Mich. Although the turntable 52 may be rotated at other speeds without departing from the scope of the present invention, in one embodiment the turntable is rotated at a speed of between about one revolution per minute and about ten revolutions per minute. Although the system 50 may spray other fluids from the spray head 54 without departing from the scope of the present invention, in one embodiment water is sprayed from the spray head. Further, although the spray head 54 may include orifices having other sizes and shapes without departing from the scope of the present invention, in one embodiment the spray head includes 0.016 inch diameter circular orifice. As the previously described high pressure fluid jet system 50 and its method of use are conventional and well understood by those skilled in the art, they will not be described in further detail.

Figure 6:
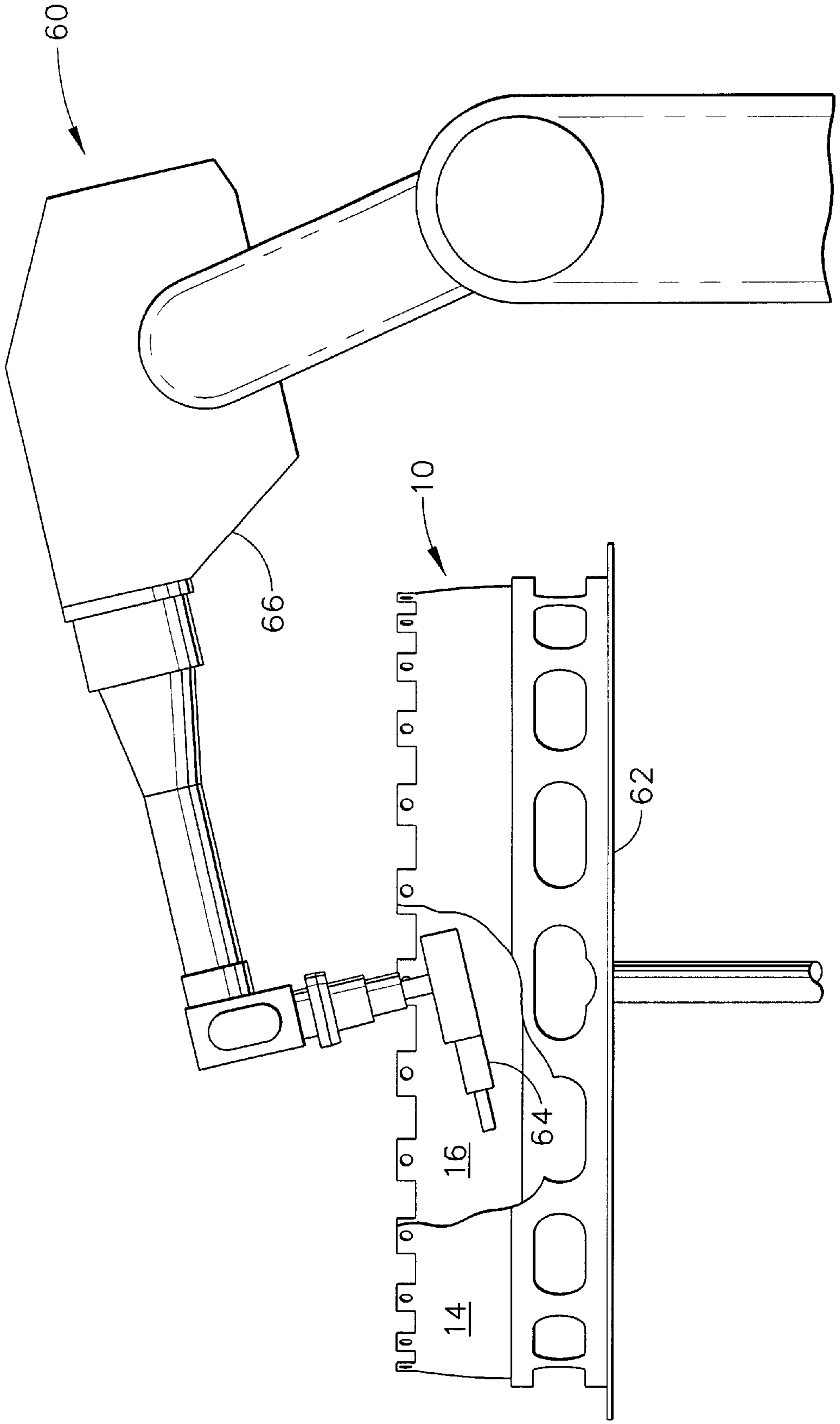
FIG. 6 is an elevation of a thermal barrier coating apparatus for coating the stripped portion of the interior surface.

After removing the coating or a preselected layer of coating from the portion of the interior surface 16, the component 10 is loaded onto a conventional thermal barrier coating apparatus, generally designated by 60, as illustrated in FIG. 6 for further processing. Although it is envisioned the masking apparatus 30 may remain in place during the thermal barrier coating process, in one embodiment the masking apparatus is removed before being loaded onto the thermal barrier coating apparatus 60. The component 10 is received by a rotatable turntable 62 sized and shaped for receiving the component. A thermal barrier coating spray head 64 provided adjacent the turntable 62 applies a thermal barrier system (i.e., bond coats and thermal barrier coatings) to the previously stripped interior surface 16 of the component 10. The spray head 64 is mounted on a robotic arm 66 for manipulating the head into position relative to the component 10. Although other apparatus 60 may be used without departing from the scope of the present invention, the thermal barrier coating spray apparatus of the preferred embodiment is an ATCS plasma system with an 8-axis computer numerically controlled Fanuc robot system available from Sulzer Metco of Westbury, N.Y. Although the thermal barrier coating apparatus 60 may apply other coating systems without departing from the scope of the present invention, in one embodiment the system is an air plasma sprayed thermal barrier coating having a nominal thickness of about 0.020 inches applied over a NiCrAlY bond coat having a nominal thickness of about 0.006 inches. As the previously described thermal barrier coating system 60 and its method of use are conventional and well understood by those skilled in the art, they will not be described in further detail. It is envisioned that the mixing and cooling holes 12, 18, respectively, may be masked prior to applying the thermal barrier coating system or they may be re-drilled after applying the system.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions without departing from the scope of the invention, it is intended that all matter contained in the above description or shown in the accompanying drawings shall be interpreted as illustrative and not in a limiting sense.

What is claimed is:

1. Apparatus for masking a surface of a component to permit selective stripping of coating therefrom, said apparatus comprising:

a flexible sheet sized and shaped for positioning over a region of the surface of the component adjacent a portion of the coated surface to be stripped;

a clamp adapted for forming the flexible sheet to a non-planar contour generally corresponding to a contour of the surface of the component and for holding the sheet in position adjacent the surface of the component; and a fastener for fastening the clamp to at least one of the surface of the component and the sheet.

2. Apparatus as set forth in claim 1 wherein the clamp comprises an elongate body sized for spanning at least a portion of the sheet.

3. Apparatus as set forth in claim 1 wherein the fastener includes a bolt threaded through the clamp.

4. Apparatus for masking a surface of a component to permit selective stripping of coating therefrom, said apparatus comprising:

a flexible sheet sized and shaped for positioning over a region of the surface of the component adjacent a portion of the coated surface to be stripped;

a clamp for forming the flexible sheet to a contour generally corresponding to a contour of the surface of the component and for holding the sheet in position adjacent the surface of the component, the clamp comprising a plurality of jack screws threaded through the body for biasing the sheet toward the surface of the component; and a fastener for fastening the clamp to at least one of the surface of the component and the sheet.

5. Apparatus for masking a surface of a component to permit selective stripping of coating therefrom, said apparatus comprising:

means for fastening a mask sheet to the component over a region adjacent said portion of the coated surface, said mask sheet having a contour generally corresponding to a contour of the surface of the component;

means for spraying a high pressure fluid jet from a spray head toward the portion of the coated surface after the mask sheet is fastened to the component to strip the coating from the portion of the surface; and means for removing the mask sheet from the component after the coating is stripped from the portion of the surface.

* * * * *